(12) United States Patent
Sim

(10) Patent No.: US 8,946,804 B2
(45) Date of Patent: Feb. 3, 2015

(54) SEMICONDUCTOR DEVICE AND METHOD OF MANUFACTURING THE SAME

(71) Applicant: Samsung Electronics Co., Ltd., Suwon-Si, Gyeonggi-Do (KR)

(72) Inventor: Jae-Hwang Sim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/852,578

(22) Filed: Mar. 28, 2013

(65) Prior Publication Data

US 2013/0256761 A1    Oct. 3, 2013

(30) Foreign Application Priority Data

Mar. 30, 2012  (KR) .................. 10-2012-0033086

(51) Int. Cl.
   *H01L 29/788*   (2006.01)
   *H01L 21/76*    (2006.01)
(52) U.S. Cl.
   USPC .......................................... 257/315; 438/422
(58) Field of Classification Search
   USPC .................. 438/421–422, 456; 257/315, 410, 257/E21.573, E21.666
   See application file for complete search history.

(56) References Cited

U.S. PATENT DOCUMENTS

| | | | |
|---|---|---|---|
| 7,535,052 B2 | 5/2009 | Kwon et al. | |
| 7,569,465 B2 | 8/2009 | Chen et al. | |
| 7,629,213 B2 | 12/2009 | Cho et al. | |
| 7,800,155 B2 * | 9/2010 | Matsuno | ................. 257/315 |
| 7,868,376 B2 | 1/2011 | Aoyama et al. | |

FOREIGN PATENT DOCUMENTS

| | | |
|---|---|---|
| JP | 2010040753 A | 2/2010 |
| JP | 2010087160 A | 4/2010 |
| KR | 100687399 B1 | 2/2007 |
| KR | 100794085 B1 | 1/2008 |
| KR | 20080061172 A | 7/2008 |
| KR | 100875055 B1 | 12/2008 |

* cited by examiner

*Primary Examiner* — Calvin Lee
(74) *Attorney, Agent, or Firm* — Harness, Dickey & Pierce, P.L.C.

(57) ABSTRACT

A semiconductor device, and a method of fabrication the same, include selection gate patterns extending in a first direction on a substrate, cell gate patterns extending in parallel in the first direction between the selection gate patterns adjacent to each other, and contact pads connected to first end parts of the cell gate patterns, respectively. An insulating layer covers the selection gate patterns, the cell gate patterns, and the contact pads. The insulating layer includes a void or seam between the contact pads. A filling insulating layer fills the void or seam in the insulating layer.

13 Claims, 19 Drawing Sheets

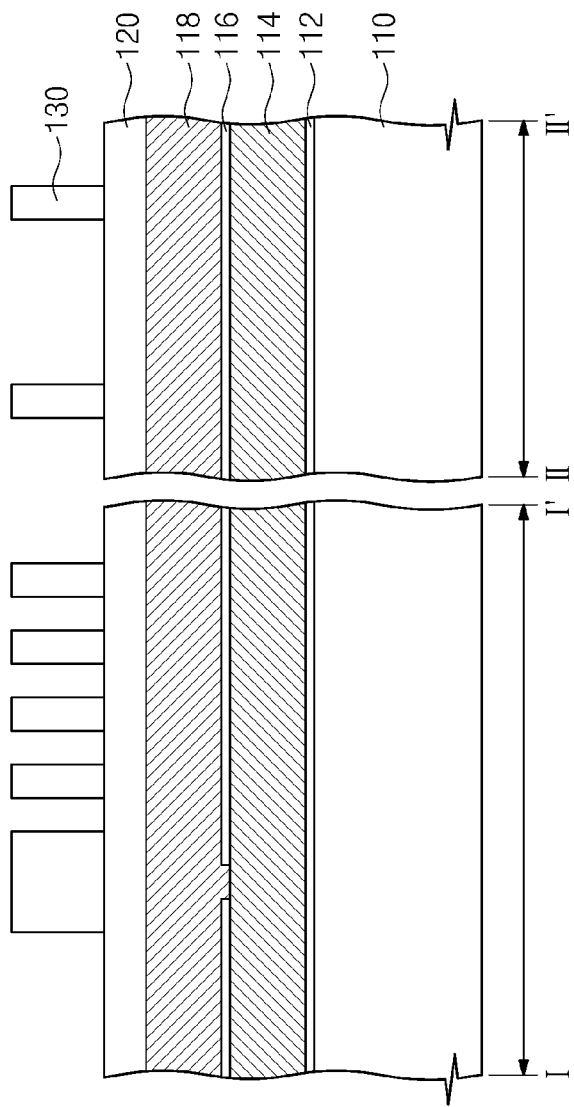

US 8,946,804 B2

SEMICONDUCTOR DEVICE AND METHOD OF MANUFACTURING THE SAME

CROSS-REFERENCE TO RELATED APPLICATIONS

This U.S. non-provisional patent application claims the benefit of priority under 35 U.S.C. §119 to Korean Patent Application No. 10-2012-0033086, filed on Mar. 30, 2012 in the Korean Intellectual Property Office, the entirety of which is incorporated herein by reference.

BACKGROUND

1. Field

Example embodiments relate to a semiconductor device and/or a method of manufacturing the same and, more particularly, to a NAND-flash memory device and/or a method of manufacturing the same.

2. Related Art

Semiconductor devices have been used in various electronic industries in part due to their small size, multi-functionality and/or low manufacture costs. The semiconductor devices may include semiconductor memory devices storing data, semiconductor logic devices processing operations of logical data, and hybrid semiconductor devices having both the function of the semiconductor memory devices and the function of the semiconductor logic devices.

As the electronic industries become more highly developed, the semiconductor devices are increasingly integrated. Thus, it is more and more difficult to realize semiconductor devices by the occurrence of various problems, for example, a process margin reduction of a photolithography process defining fine patterns. Additionally, high speed semiconductor devices are more in demand with the development of the electronic industries. Thus, various research has been conducted for satisfying the demands of high integration and/or high speed of semiconductor devices.

SUMMARY

One example embodiment provides highly-integrated semiconductor devices.

Another example embodiment provides methods of manufacturing the semiconductor devices.

In one example embodiment, a semiconductor device may include selection gate patterns extending in a first direction on a substrate; cell gate patterns extending in parallel in the first direction between the selection gate patterns adjacent to each other; contact pads connected to first end parts of the cell gate patterns, respectively; an insulating layer covering the selection gate patterns, the cell gate patterns, and the contact pads, the insulating layer having a void or seam between the contact pads; and a filling insulating layer filling the void or seam in the insulating layer.

In some example embodiments, the filling insulating layer may include an atomic layer deposition (ALD) nitride or an ALD oxide.

In other example embodiments, a width of each of the cell gate patterns may be substantially equal to a distance between the cell gate patterns adjacent to each other, and the insulating layer includes an air gap insulating the cell gate patterns.

In still other example embodiments, the contact pads and the cell gate patterns connected to each other may constitute one body, and each of the contact pads may have a first width along the first direction and a second width along a second direction substantially perpendicular to the first direction in a plan view, the second width being larger the first width.

In even other example embodiments, the cell gate patterns adjacent to each other may be spaced apart by a distance having a first width, the cell gate patterns and the selection gate patterns adjacent to each other may be spaced apart by the distance having the first width, and the contact pads adjacent to each other may be spaced apart by a distance having a second width greater than the first width.

In yet other example embodiments, the contact pads adjacent to each other may be minor-symmetric to each other with respect to a standard line extending in a second direction perpendicular to the first direction between the contact pads adjacent to each other in a plan view.

In yet still example embodiments, the cell gate patterns may have mirror symmetry with respect to a standard line extending in the first direction.

In yet still example embodiments, the cell gate patterns may have lengths different from each other, and the cell gate patterns may be arranged according to length such that the lengths of the cell gate patterns increase the closer the cell gate patterns are to the standard line.

In yet still example embodiments, the contact pads may be respectively at empty regions defined by length differences in the lengths of the cell gate patterns in a plan view.

In yet still example embodiments, the cell gate patterns have second end parts extending in a direction tilted with respect to the standard line in a plan view.

In yet still example embodiments, the direction tilted with respect to the standard line may extend away from the standard line.

In another example embodiment, a method of manufacturing a semiconductor device may include sequentially forming a tunnel insulating layer, a conductive pattern, a dielectric layer, a conductive layer, a mask layer, and a sacrificial patterns on a substrate; forming spacers on respective sidewalls of the sacrificial patterns; removing the sacrificial patterns to form openings exposing a surface of the mask layer between the spacers; forming mask patterns each filling one of the openings; successively etching the mask layer, the conductive layer, the dielectric layer, the conductive pattern, and the tunnel insulating layer by performing an etching process using the mask patterns to form selection gate patterns, cell gate patterns, and contact pads; forming an insulating layer covering the selection gate patterns, the cell gate patterns, and the contact pads; and forming a filling insulating layer filling a void or seam in the insulating layer between the contact pads.

In some example embodiments, each of the sacrificial patterns may have a first width in a region where the cell gate patterns; and the forming spacers on respective sidewalls of the sacrificial patterns may include forming the spacers to each have a width equal to the first width.

In other example embodiments, the forming an insulating layer may include forming a cavity including air between the cell gate patterns and conformally forming the insulating layer between the contact pads.

In still other example embodiments, the forming a filling insulating layer includes performing an atomic layer deposition (ALD) process.

In a further example embodiment, a semiconductor device includes selection gate patterns on a substrate extending in a first direction, cell gate patterns extending in the first direction between the selection gate patterns, contact pads each connected to an end of one of the cell gate patterns, an insulating layer structure configured to insulate the contact pads from each other, the insulating layer structure including a shell formed of a first insulating material and a first core formed of a second insulating material different than the first insulating material. The first core is surrounded by the shell and between the contact pads adjacent to each other.

In some example embodiments, the contact pads may extend in a direction away from a center of the semiconductor device in plan view.

In other example embodiments, the contact pads may be staggered in pairs at an end of the semiconductor device in plan view, the insulating layer structure may include a second core formed of the second insulating material, and the second core may be surrounded by the shell and between the pairs of contact pads adjacent to each other.

In even further example embodiments, each of the contact pads may be integrally formed with one of the cell gate patterns.

In still even further example embodiments, the insulating layer structure may further include a passage connected to a cavity including air between the cell gate patterns adjacent to each other; and the first core may be configured to seal the passage.

BRIEF DESCRIPTION OF THE DRAWINGS

The example embodiments will become more apparent in view of the attached drawings and accompanying detailed description.

FIGS. 5A to 5I are cross-sectional views illustrating a method of manufacturing a semiconductor device according to another example embodiment;

DETAILED DESCRIPTION OF THE EXAMPLE EMBODIMENTS

Figure 1:
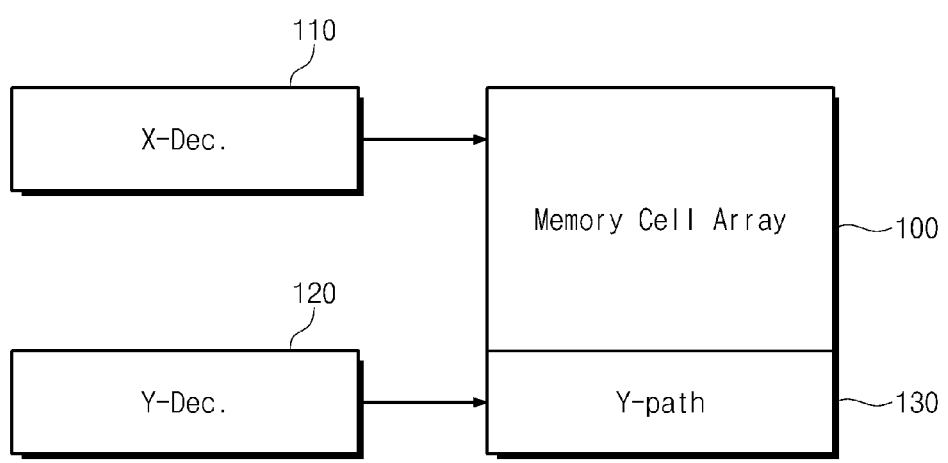
FIG. 1 is a schematic block diagram illustrating a non-volatile memory device.

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings.

Example embodiments relate to a semiconductor device and/or a method of manufacturing the same and, more particularly, to a NAND-flash memory device and/or a method of manufacturing the same.

Figure 2:
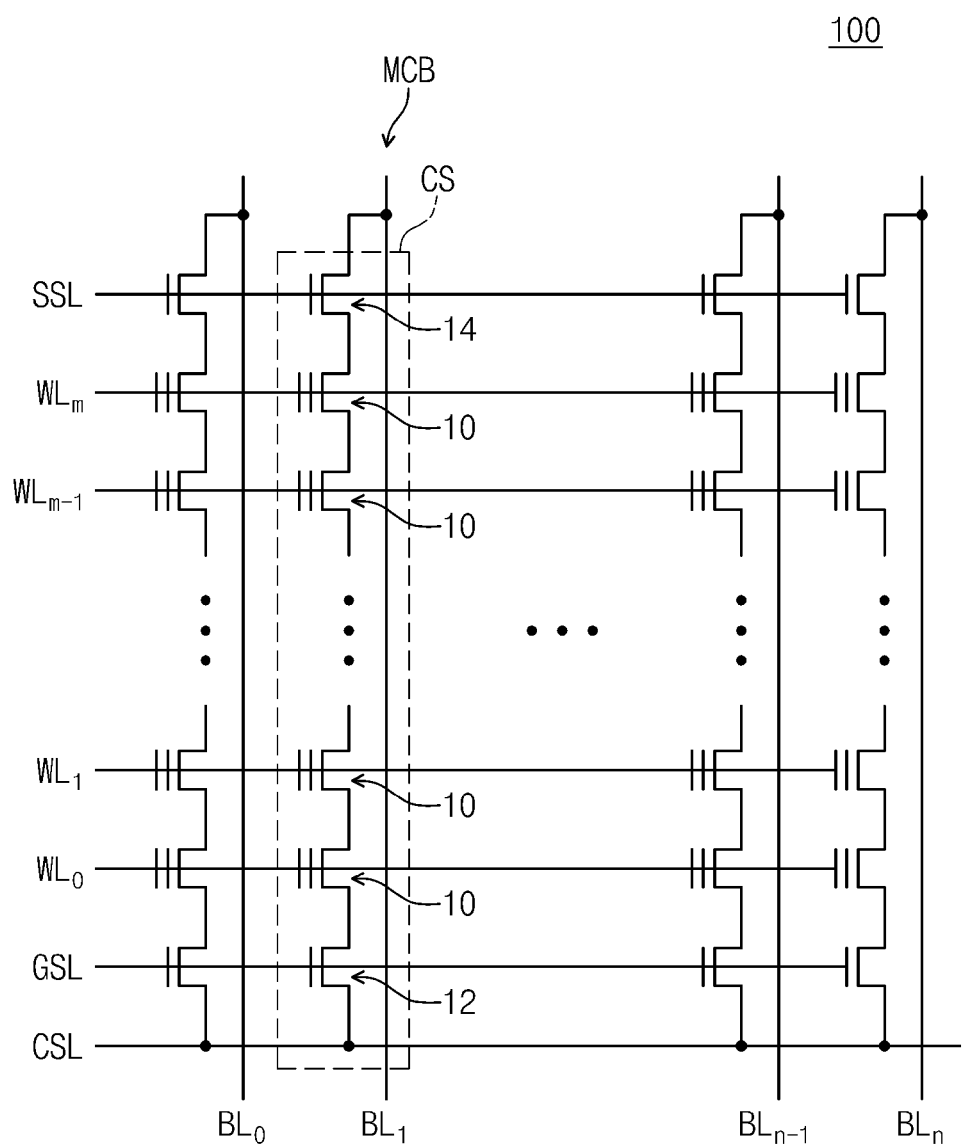
FIG. 2 is a circuit diagram illustrating a memory cell array of a non-volatile memory device.

FIG. 1 is a schematic block diagram illustrating a non-volatile memory device, and FIG. 2 is a circuit diagram illustrating a memory cell array of a non-volatile memory device.

Referring to FIGS. 1 and 2, a non-volatile memory device may include a memory cell array 100, and a peripheral circuit including a X-decoder 110 and a Y-decoder 120.

A plurality of conductive lines forming unit cells, for example, a plurality of word lines WL0, WL1, ..., WLm−1, and WLm and a plurality of bit lines BL0, BL1, ..., BLn−1, and BLn may cross over each other and be repeatedly disposed in the memory cell array 100. The memory cell array 100 may be connected to the X-decoder 110 configured for selecting the word lines WL0, WL1, ..., WLm−1, and WLm, and the Y-decoder 120 configured for selecting the bit lines BL0, BL1, ..., BLn−1, and BLn. Additionally, a Y-path 130 may be connected between the Y-decoder 120 and the memory cell array 100. The Y-path 130 may perform a function selecting paths of the bit lines BL0, BL1, ..., BLn−1, and BLn.

The memory cell array 100 may include a plurality of memory cell blocks MCB. Each of the memory cell blocks MCB may include a plurality of cell strings CS formed between the bit line and common source line CSL. Each of the cell strings CS may include a plurality of memory cells 10 connected in series to each other. Gate electrodes of memory cells 10 constituting each of the cell strings CS may be connected to the word lines WL0, WL1, ..., WLm−1, and WLm different from each other, respectively. A ground selection transistor 12 connected to a ground selection line GSL and a string selection transistor 14 connected to a string selection line SSL may be connected to both ends of each of the cell strings CS, respectively. The ground selection transistor 12 and the string selection transistor 14 may control electrical connection between the bit line BL0, BL1, ..., BLn−1, or BLn and the plurality of memory cells 10 and electrical connection between the common source line CSL and the plurality of memory cells 10. The memory cells of the plurality of cell strings CS, which are connected to one of the word lines WL0, WL1, ..., WLm−1, and WLm, may constitute a page unit or a byte unit.

In the NAND flash memory device, one of the word lines WL0, WL1, ..., WLm−1, and WLm and one of the bit lines BL0, BL1, ..., BLn−1, and BLn may be selected using the X-decoder 110 and the Y-decoder 120, and the memory cell 10 connected to the selected word line WL0, WL1, ..., WLm−1, or WLm and the selected bit line BL0, BL1, ..., BLn−1, or BLn may be selected, and then a read operation or a write operation may be performed on the selected memory cell 10.

Hereinafter, the cell strings of the memory cell array will be described in more detail.

Figure 3:
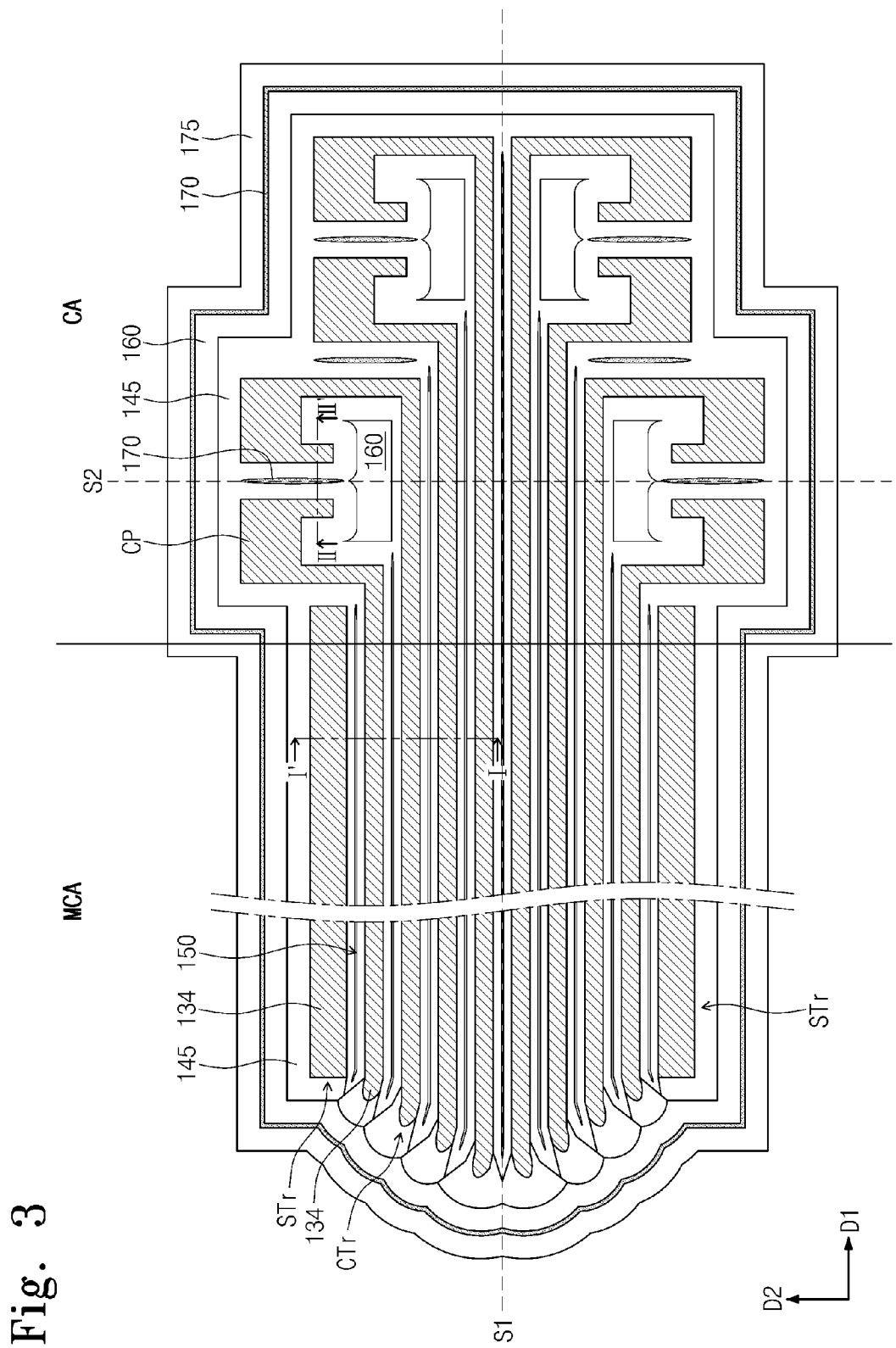
FIG. 3 is a plan view illustrating a semiconductor device according to an example embodiment.
Figure 4:
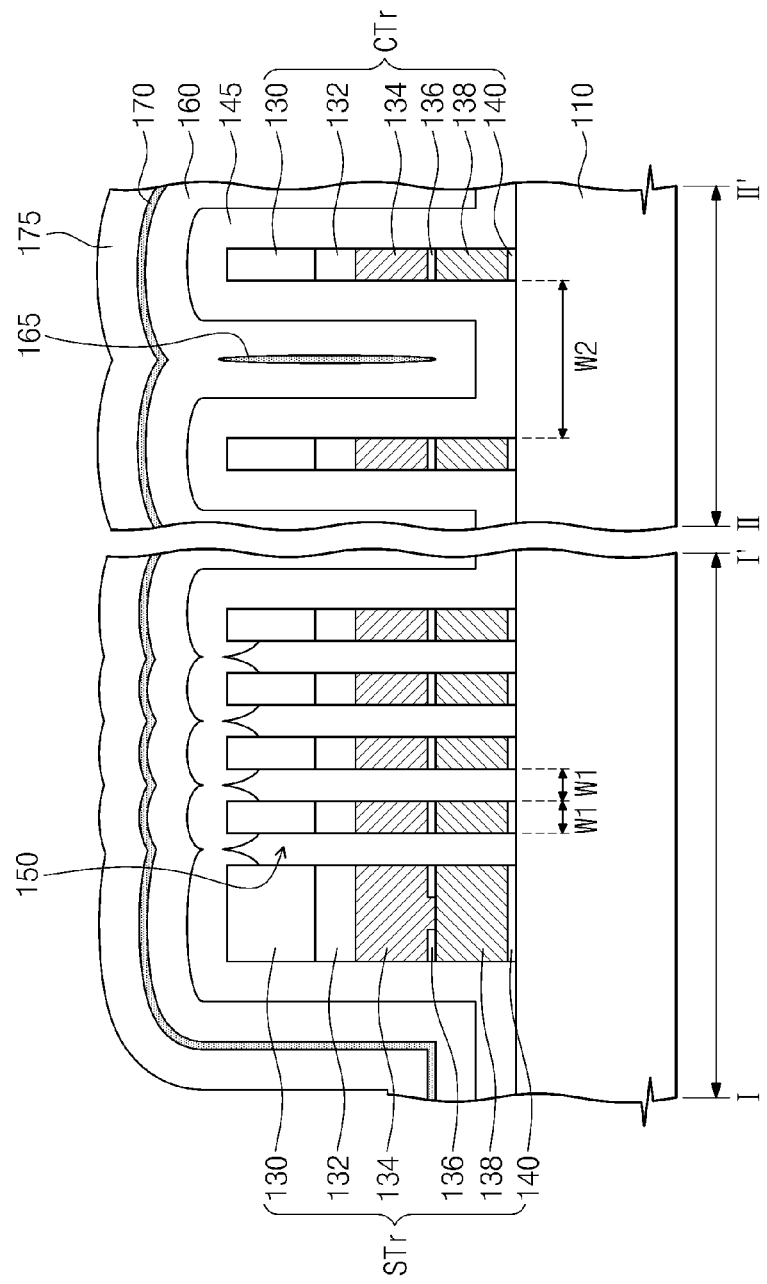
FIG. 4 is a cross-sectional view taken along line I-I' and II-II' of FIG. 3.

FIG. 3 is a plan view illustrating a semiconductor device according to an example embodiment, and FIG. 4 is a cross-sectional view taken along lines I-I' and II-II' of FIG. 3.

Referring to FIGS. 3 and 4, a semiconductor device may include a substrate 110 including a memory cell region MCA and a contact region CA, and selection gate patterns STr of selection transistors and cell gate patterns CTr of cell transistors disposed on the substrate 110. In some example embodiments, a plurality of the cell gate patterns CTr may have minor-symmetry with respect to a first standard line S1 extending in a first direction D1.

The cell gate patterns CTr may extend in the first direction D1 to cross over the memory cell region MCA and the contact region CA. Each of the cell gate patterns CTr may include a tunnel insulating pattern 140, a floating gate 138, a dielectric pattern 136, and a control gate 134. The cell gate patterns CTr may be substantially parallel to each other. In some example embodiments, the cell gate patterns CTr may have lengths different from each other. Extending lengths of the control gates 134 of the cell gate patterns CTr may gradually increase the closer the control gates 134 are to the first standard line S1 of the mirror-symmetry. In FIG. 4, a reference numeral '132' is a first mask, and a reference numeral '130' is a second mask.

In some example embodiments, each of the cell gate patterns CTr may have a first width W1. The first width W1 may be fine by several tens nm. Additionally, the cell gate patterns CTr may be spaced apart from each other at equal distances and may be substantially parallel to each other. A spacing distance between the cell gate patterns CTr adjacent to each other may be substantially equal to the first width W1 of the cell gate pattern CTr. For example, the cell gate patterns CTr may have a line and space structure.

The cell gate patterns CTr may be electrically connected to contact pads CP, respectively. In some example embodiments, the contact pad CP may be connected to a first end part of the cell gate pattern CTr, and the contact pad CP and the cell gate pattern CTr may constitute one body. In some embodiments, the contact pads CP may be disposed in the contact region CA. Each of the contact pads CP may be enlarged in the first direction D1 and a second direction D2 perpendicular to the first direction D1 in a plan view. Thus, each of the contact pads CP may have a width greater than that of each of the cell gate patterns CTr. As a result, it is possible to increase a process margin of a contact plug formed in a subsequent process.

As described above, the extending lengths of the cell gate patterns CTr may gradually decrease the farther the control gates 134 are from the first standard line S1, and the contact pads CP may be respectively disposed at empty regions occurring by length differences of the cell gate patterns CTr in a plan view.

Additionally, the contact pads CP adjacent to each other may be mirror-symmetric to each other with respect to a second standard line S2 extending in the second direction D2 between the contact pads CP adjacent to each other. A distance between the contact pads CP may have a second width W2 greater than the first width W1.

In some example embodiments, a second end part of each of the cell gate patterns CTr may extend to be tilted with respect to the first standard line S1 in a plan view. The second end part of each of the cell gate patterns CTr may extend to be tilted (or, alternatively, extend) in a direction far away from the first standard line S1 in a plan view. This is because a short between the cell gate patterns CTr adjacent to each other is prevented in a patterning process including a photolithography process and an etching process.

The selection gate patterns STr may include a ground selection gate pattern of the ground selection transistor 12 of FIG. 2 and a string selection gate pattern of the string selection transistor 14 of FIG. 2. The cell gate patterns CTr may be disposed between the ground selection gate pattern and the string selection gate pattern. Additionally, the selection gate patterns STr may extend in the first direction D1 in the memory cell region MCA. The selection gate patterns STr and the cell gate patterns CTr may be substantially parallel to each other.

Each of the selection gate patterns STr may include a gate insulating layer 140 and a gate electrode 134 and 138. Each of the selection gate patterns may include substantially the same materials as those of the cell gate pattern CTr. In a process forming the cell gate patterns CTr, a dielectric layer 136 between a layer for the floating gates 138 and a layer for the control gates 134 may be partially removed by a butting process in a region in which the selection gate pattern STr is formed.

The semiconductor device may further include a first insulating layer 145, a second insulating layer 160, a filling insulating layer 170, and a third insulating layer 175 which cover the cell gate patterns CTr and the selection gate patterns STr. The first insulating layer 145 may include phenyltriethoxysilane (PTEOS), and the second insulating layer 160 may include high temperature oxide (HTO).

As described above, the cell gate patterns CTr may have the line and space structure having a width and a spaced distance of several tens nm or less. Thus, an air gap 150 may be provided in the first insulating layer 145 between the cell gate patterns STr. The air gap 150 may perform a function insulating the cell gate patterns STr adjacent to each other.

On the other hand, the distance between the contact pads CP is wider than the distance between the cell gate patterns CTr, so that a void or seam 165 smaller than the air gap 150 may be generated between the contact pads CP. The void or seam 165 may be surrounded by the first insulating layer 145 and/or the second insulating layer 160.

The filling insulating layer 170 may be disposed on the second insulating layer 160. The filling insulating layer 170 may be formed for preventing the void or seam 165 from being connected to the air gap 150. In some example embodiments, the filling insulating layer 170 may completely fill the void or seam 165. The filling insulating layer 170 may prevent the air gap 150 from being connected to the outside. Thus, it is possible to suppress movement of chemical materials into the air gap 150 through the void or seam 165 in subsequent processes. As a result, it is possible to prevent the semiconductor device from being damaged by the chemical materials.

The third insulating layer 175 may be formed on the filling insulating layer 170. The third insulating layer 175 may function as an etch stop layer or a buffer layer.

Figure 5A:
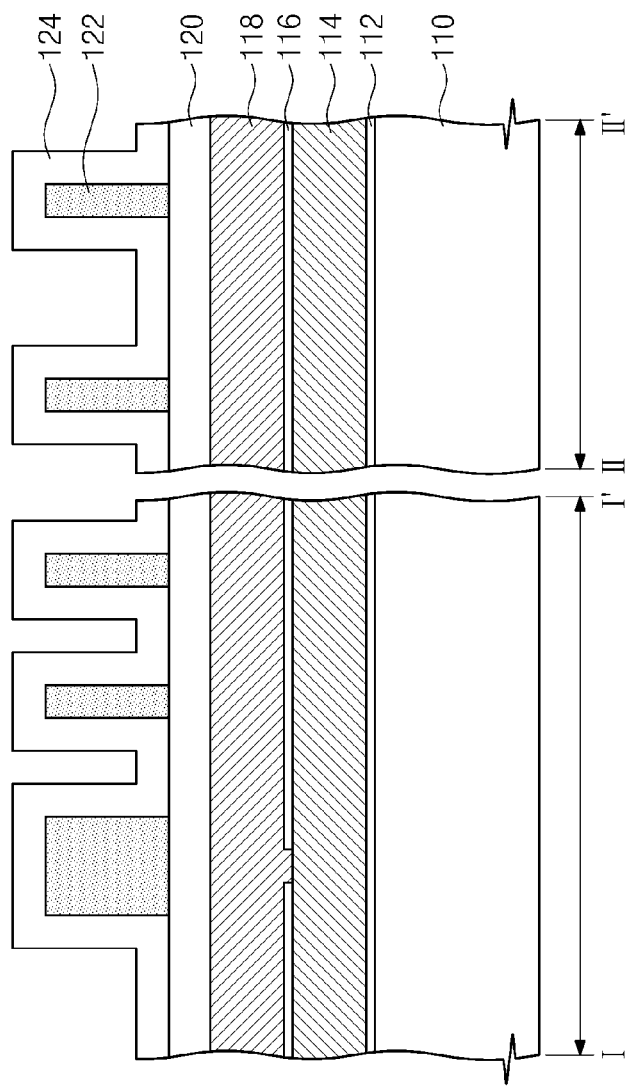
Figure 5B:
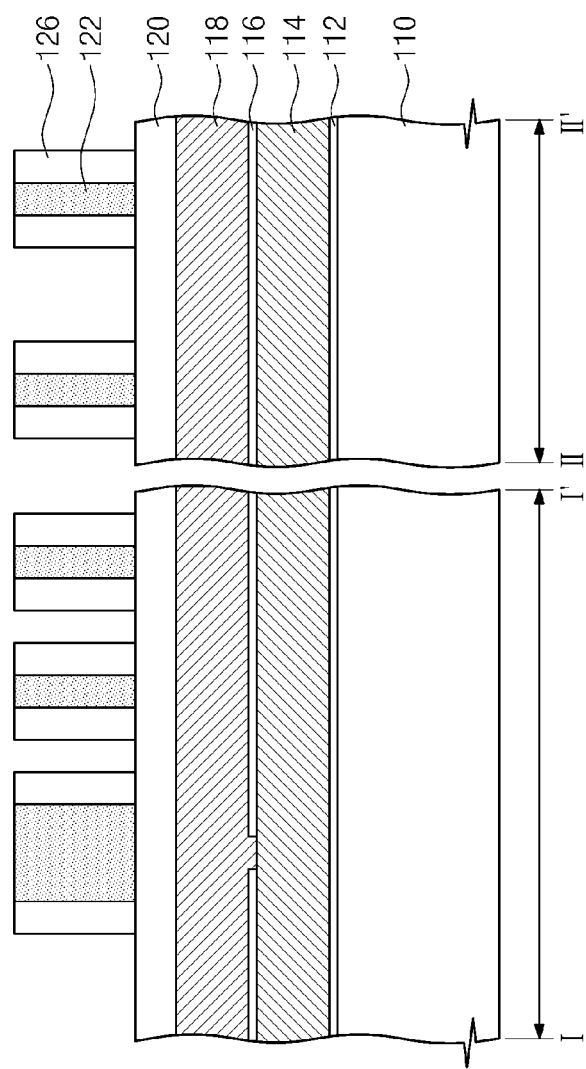
Figure 5C:
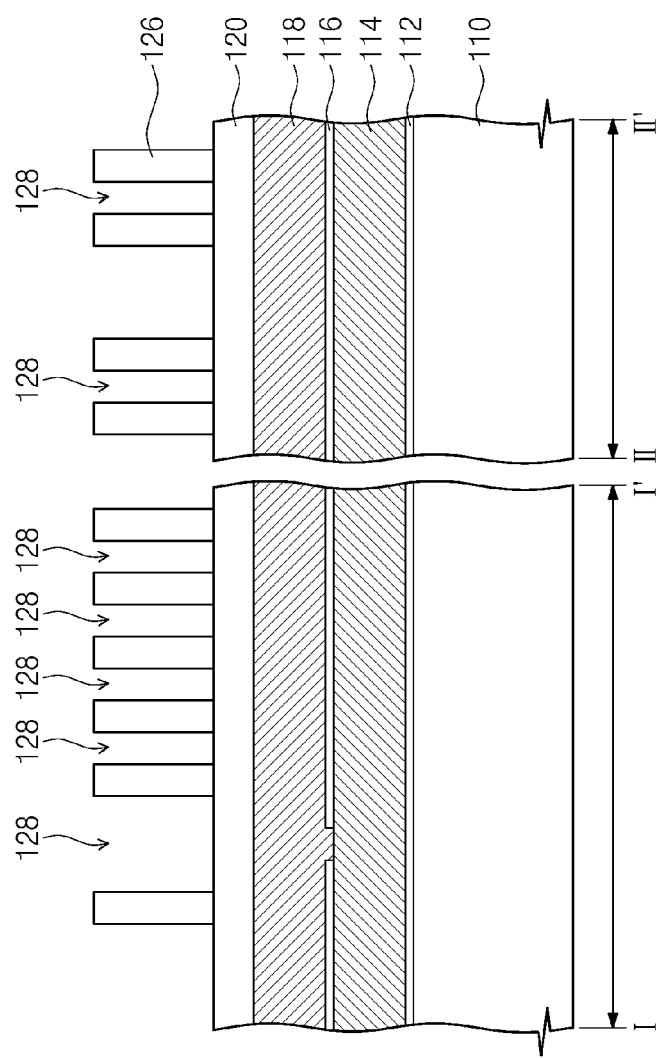
Figure 5D:
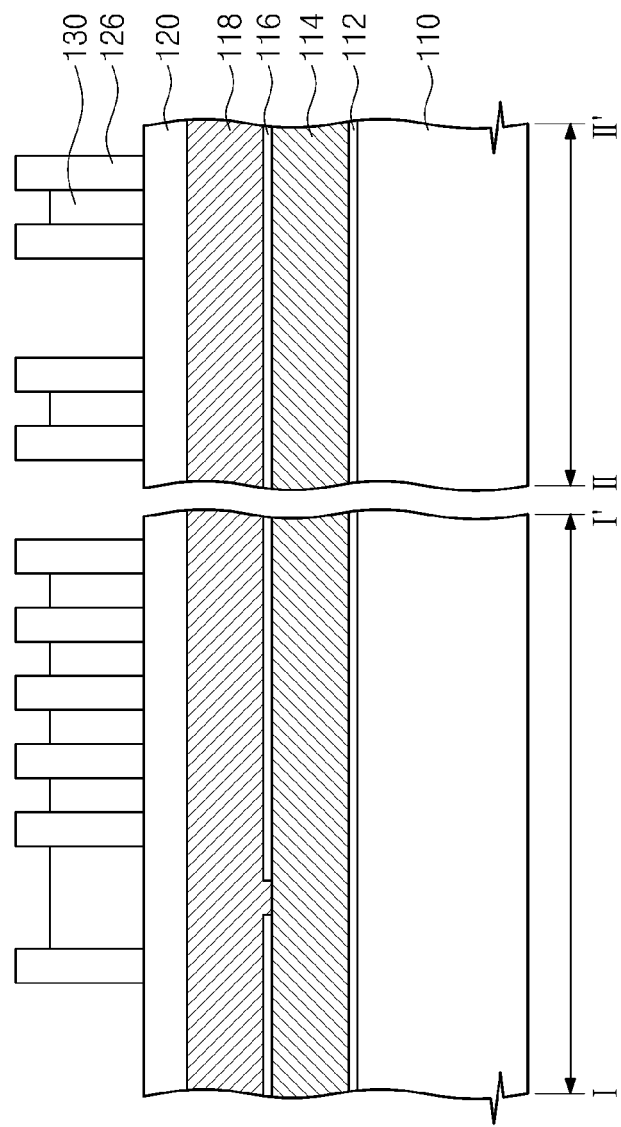
Figure 5F:
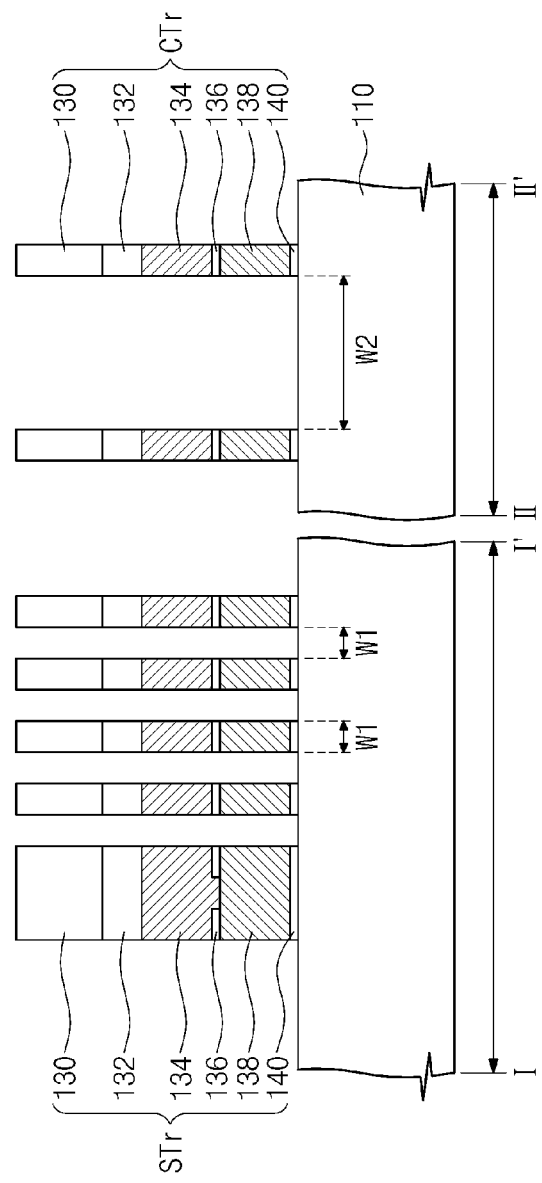
Figure 5G:
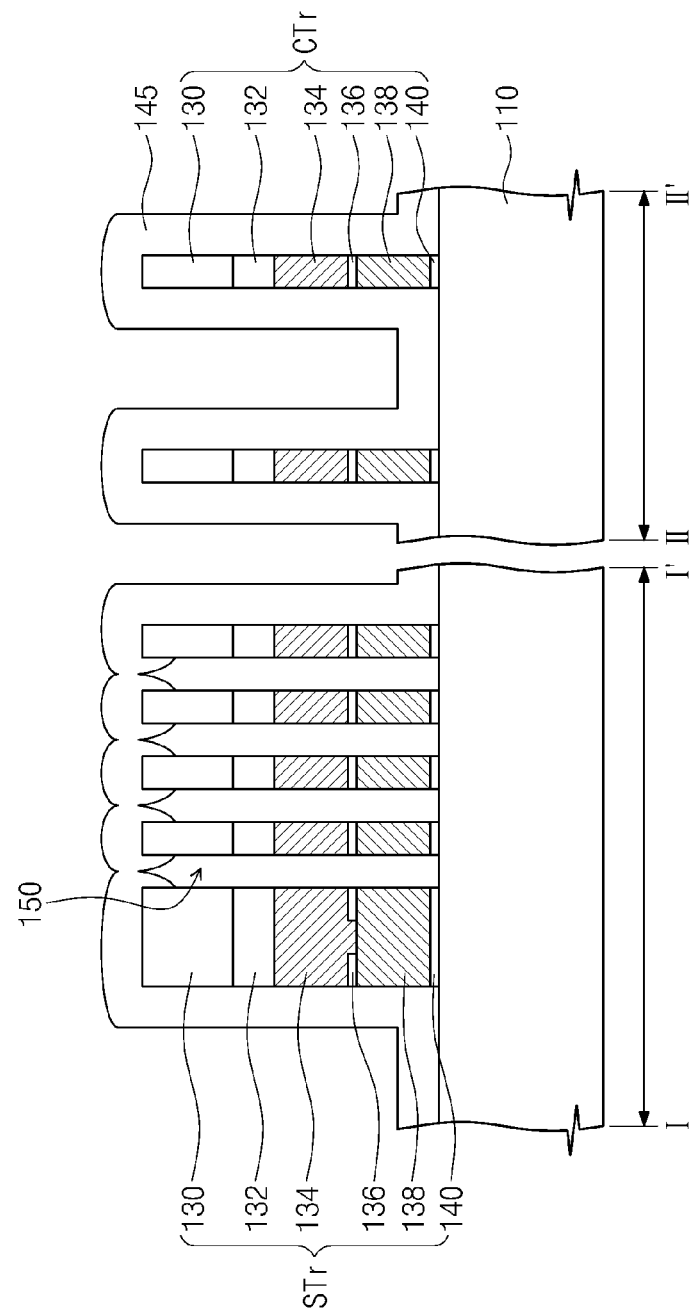
Figure 5H:
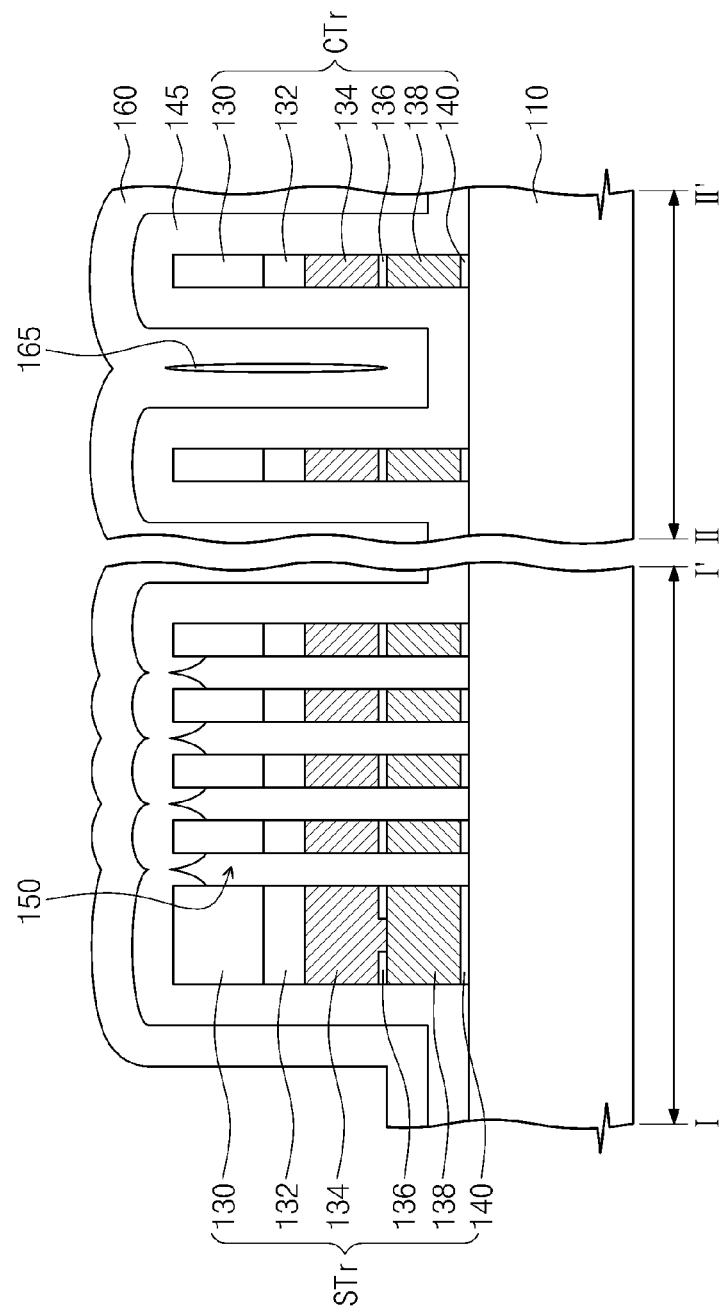
Figure 5I:
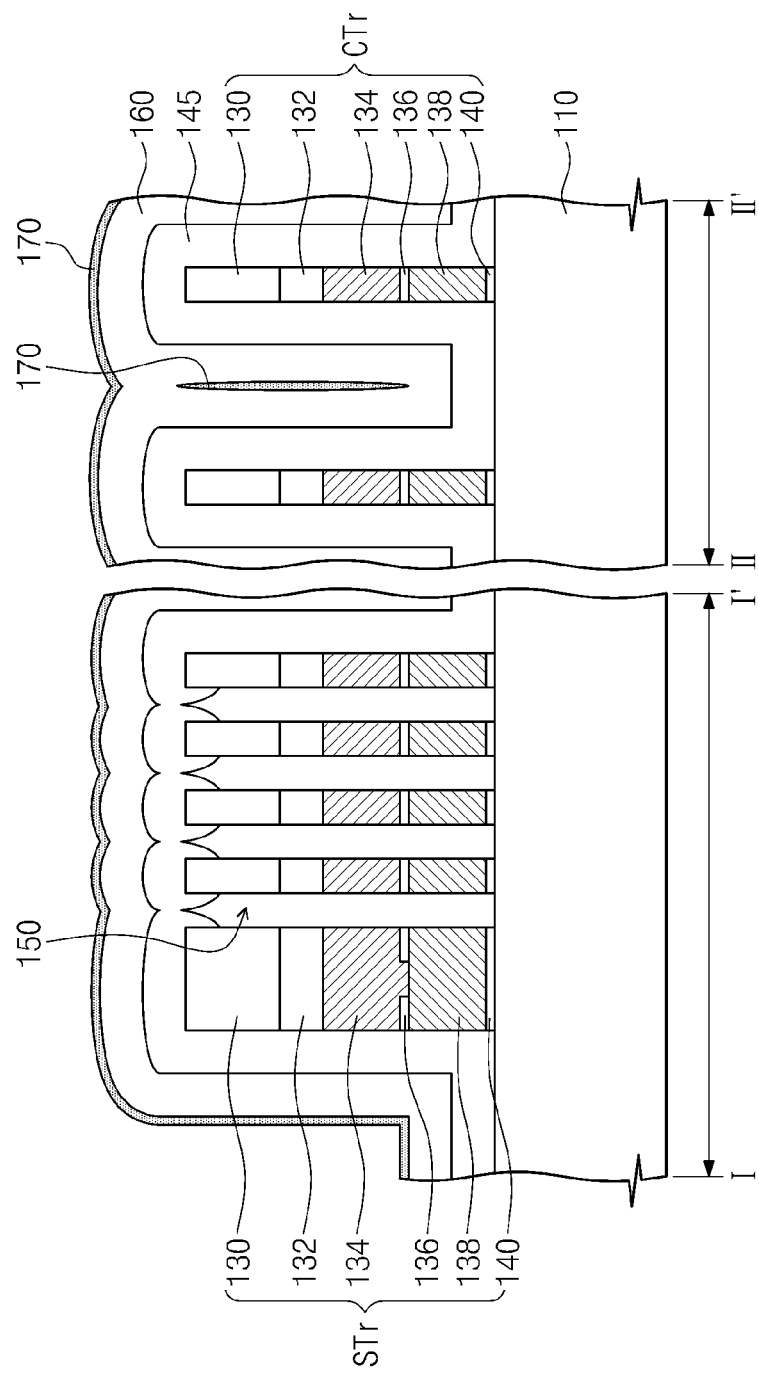
Figure 5J:
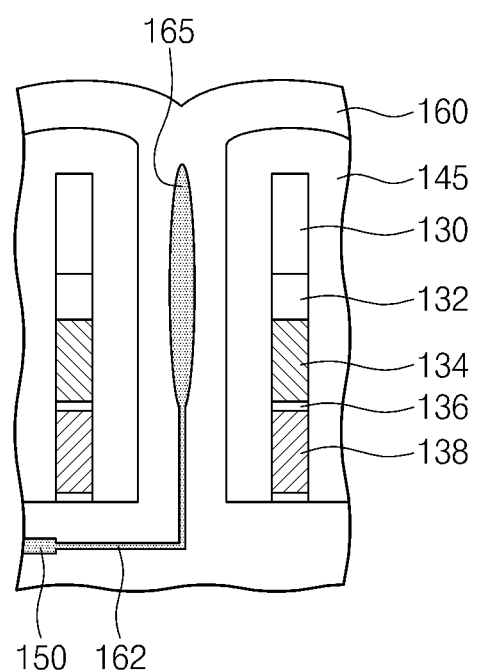
FIG. 5J is a perspective view illustrating a method of manufacturing the semiconductor device shown in FIGS. 5H and 6B.
Figure 6A:
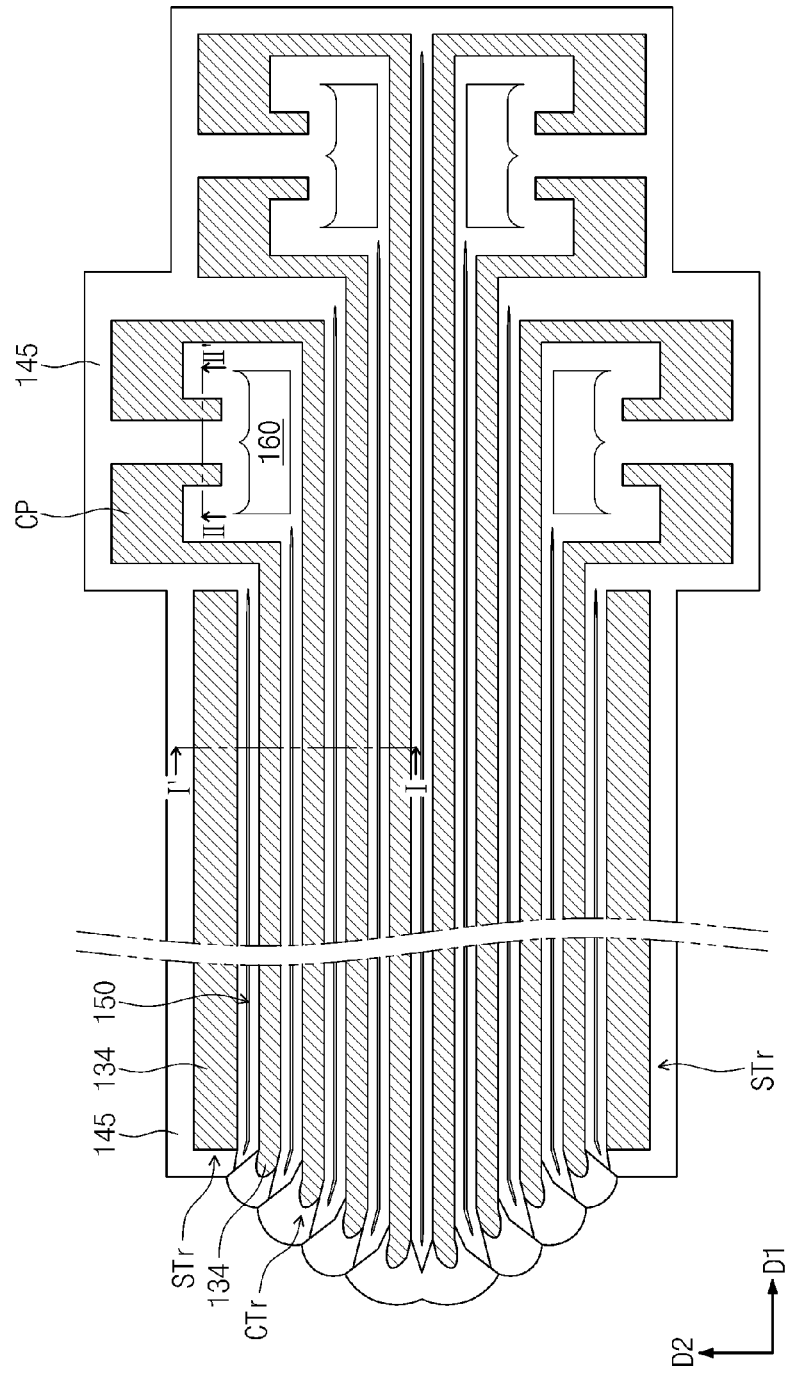
FIGS. 6A to 6C are plan views illustrating a method of manufacturing the semiconductor device shown in FIGS. 5G and 5I.
Figure 6B:
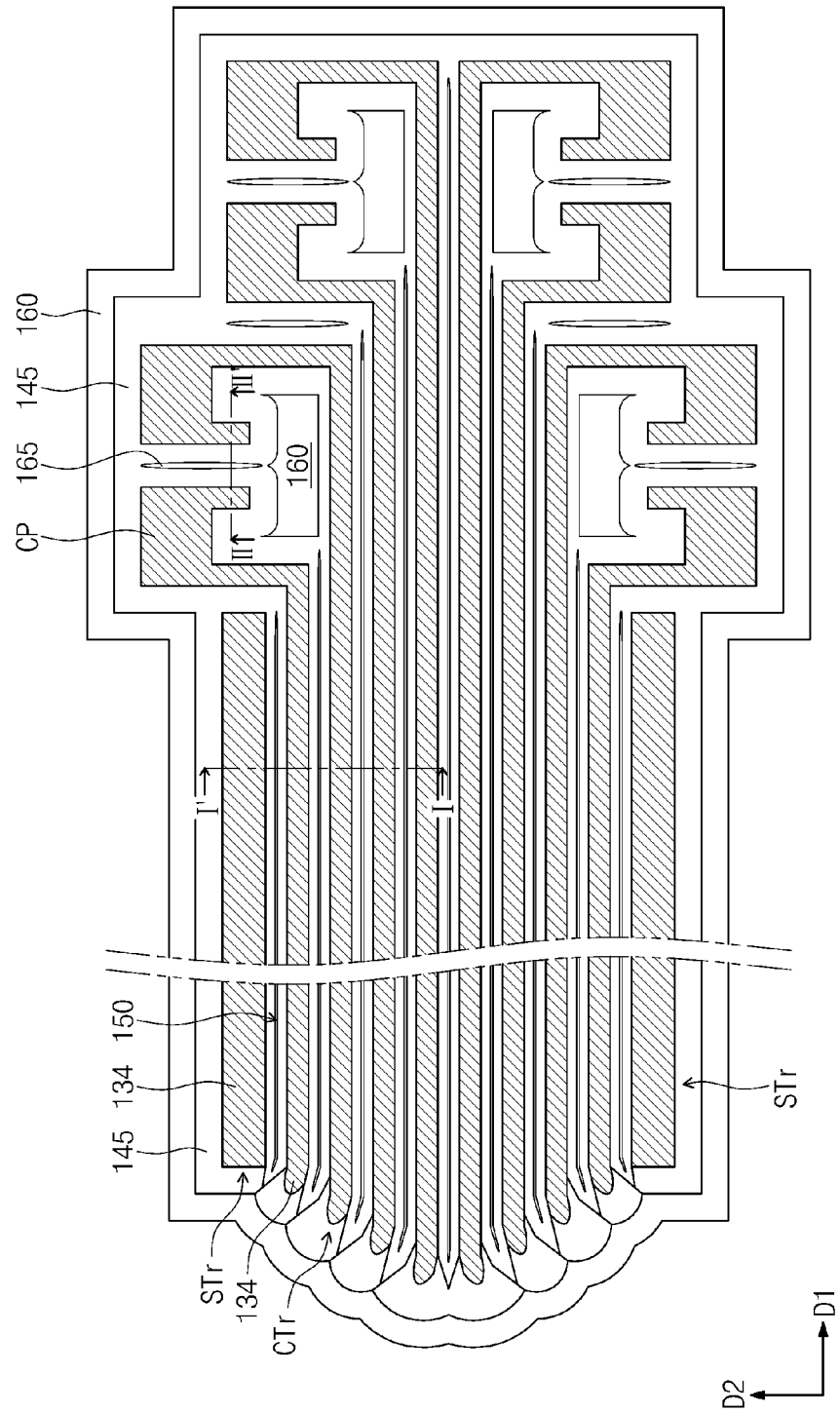
Figure 6C:
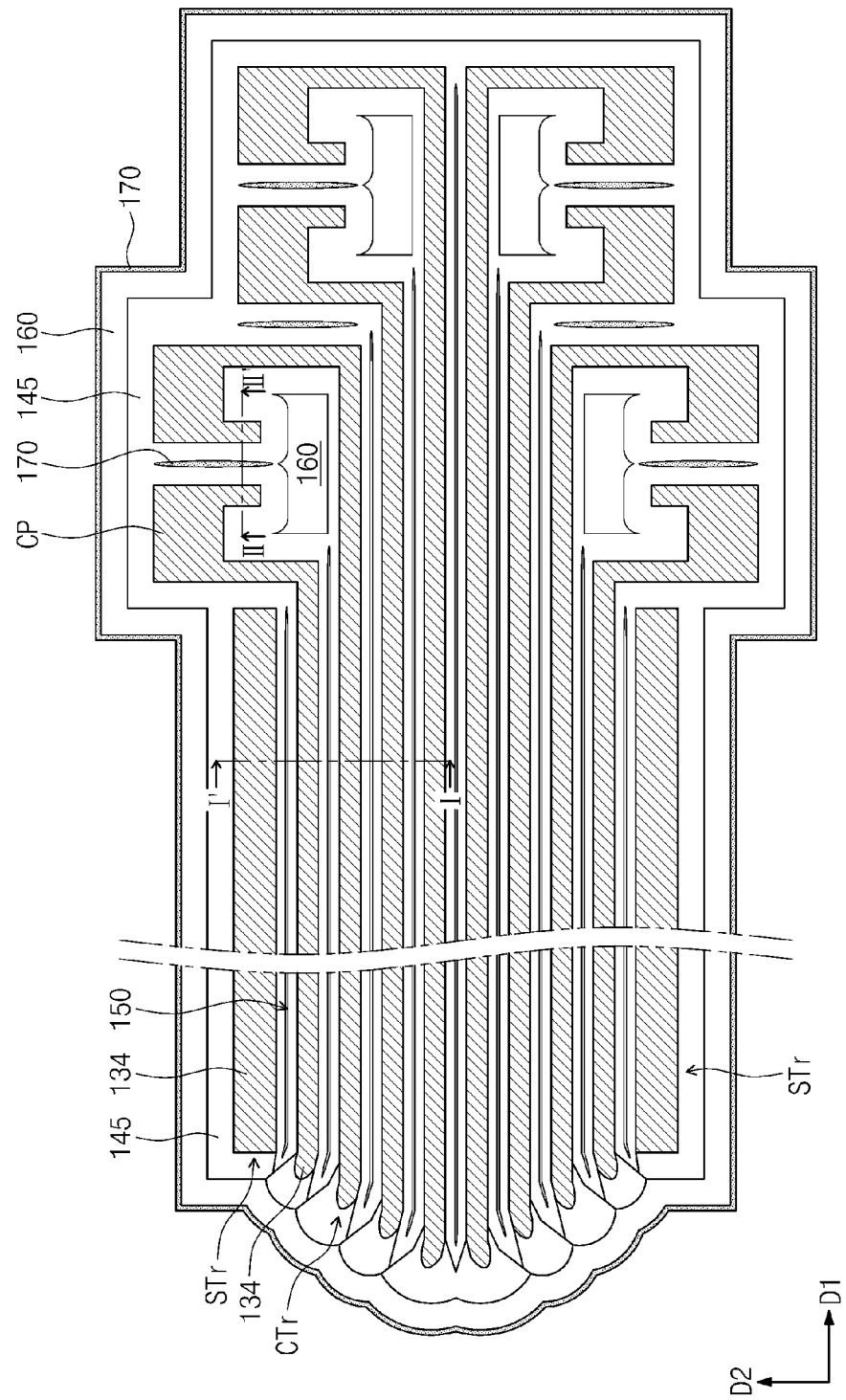

FIGS. 5A to 5I are cross-sectional views, and FIG. 5J a perspective view, illustrating a method of manufacturing a semiconductor device according to another example embodiment, and FIGS. 6A to 6C are plan views illustrating a method of manufacturing the semiconductor device shown in FIGS. 5G to 5I.

FIGS. 5A to 5F are cross-sectional views taken along lines I-I' and II-II' of FIG. 3. Additionally, FIGS. 5G to 5I are cross-sectional views taken along lines I-I' and II-II' of FIGS. 6A to 6C, respectively. FIG. 5J is a perspective view illustrating a method of manufacturing the semiconductor device shown in FIGS. 5H and 6B.

Referring to FIG. 5A, a tunnel insulating layer 112, a conductive pattern 114, a dielectric layer 116, a conductive layer 118, a mask layer 120, and sacrificial patterns 122 may be sequentially formed on a substrate 110. A spacer layer 124 may be conformally formed on the sacrificial patterns 122. The spacer layer 124 may not completely fill spaces between the sacrificial patterns 124.

The tunnel insulating layer 112 may include at least one of oxide, nitride, oxynitride, and metal oxide, and the conductive pattern 114 may include at least one of poly-silicon, metal and metal compound. The dielectric layer 116 may include at least one of oxide, nitride, oxynitride, and metal oxide, and the conductive layer 118 may include at least one of poly-silicon, metal and metal compound. The mask layer 120 may include nitride, and the sacrificial patterns 122 may include a material (e.g., oxide) having an etch selectivity with respect to the mask layer 120.

In some example embodiments, the sacrificial patterns 122 in a region where cell gate patterns CTr will be formed in a subsequent process may have a first width W1. A distance between the sacrificial patterns 122 adjacent to each other may be at least three times greater than the first width W1.

In some example embodiments, the conductive pattern 114 may have a linear shape extending in one direction. In other example embodiments, the dielectric layer 116 between the conductive pattern 114 and the conductive layer 118 may be partially etched, so that the conductive layer 118 may be electrically connected to the conductive pattern 114. This is called 'a butting process'.

Referring to FIGS. 5B and 5C, the spacer layer 124 may be etched to form spacers 126 on sidewalls of the sacrificial patterns 122. The sacrificial patterns 122 may be removed from the mask layer 120 to form openings 128 between the spacers 126.

Referring to FIGS. 5D and 5E, first mask patterns 130 may be formed between the spacers 126 to fill the openings 128. The spacers 126 may be removed.

Referring to FIG. 5F, the mask layer 120, the conductive layer 118, the dielectric layer 116, the conductive pattern 114, and the tunnel insulating layer 112 may be etched using the first mask patterns 130 as etch masks, thereby forming cell gate patterns CTr and selection gate patterns STr.

Each of the cell gate patterns CTr may include a tunnel insulating pattern 140, a floating gate 138, a dielectric pattern 136, a control gate 134, a second mask pattern 132 and the first mask pattern 130 which are sequentially stacked on the substrate 110. The control gate 134 may extend in a first direction D1. In some example embodiments, the cell gate pattern CTr may have the first width W1 and a distance between the cell gate patterns CTr adjacent to each other may be substantially equal to the first width W1.

In some example embodiments, referring to FIG. 3 again, contact pads CP may be formed at one end part of the cell gate patterns CTr. The contact pad CP and the cell gate pattern CTr connected to each other may constitute one body type without a boundary (e.g., be integrally formed). Even though not shown in detail in the drawings, shapes of the contact pads CP may be changed according to structures of masks. In the present example embodiment, the contact pads CP may be formed at the one end part of the cell gate patterns CTr in the one body type, respectively, and be enlarged in a second direction D2 perpendicular to the first direction D1 in a plan view.

Each of the selection gate pattern STr may include a gate insulating pattern 140 and gates 134 and 138 sequentially stacked on the substrate 110. Here, the gate insulating pattern 140 may be formed of a portion of the tunnel insulating layer 112. The conductive pattern 114 and the conductive layer 118 may be electrically connected to each other through the dielectric layer 116 etched by the butting process described with reference to FIG. 5A. Thus, portions of the conductive pattern 114 and the conductive layer 118 may correspond to the gates 134 and 138 of the selection gate pattern STr.

Referring to FIGS. 5G and 6A, a first insulating layer 145 may be formed on the substrate 110 which the cell gate patterns CTr and the selection gate patterns STr are formed on. The first insulating layer 145 may include an oxide such as PTEOS.

In some example embodiments, a distance between the cell gate patterns CTr adjacent to each other and a distance between the cell gate pattern CTr and the selection gate pattern STr adjacent to each other may be fine under several tens nm, so that the first insulating layer 145 may not fill the spaces between the cell and selection gate patterns CTr and STr. Thus, air gaps 150 may be generated. The air gap 150 and the first insulating layer 145 may, collectively, insulate the cell gate patterns CTr.

Meanwhile, a distance between the contact pads CP adjacent to each other may have a second width W2 greater than the first width W1. In some example embodiments, the first insulating layer 145 may be conformally formed between the contact pads CP.

Referring to FIGS. 5H, 5J and 6B, a second insulating layer 160 may be formed on the first insulating layer 145. The second insulating layer 160 may include an oxide such as HTO.

In some example embodiments, the second insulating layer 160 may be formed over top surfaces of the cell gate patterns CTr. The second insulating layer 160 may be formed on sidewalls and top surfaces of the selection gate patterns STr. The second insulating layer 160 may be formed on a sidewall of the selection gate pattern STr which is opposite to a sidewall thereof adjacent to the cell gate pattern CTr. Additionally, the second insulating layer 160 may be formed on sidewalls and top surfaces of the contact pads CP.

In some example embodiments, a void or seam 165 may be generated between the contact pads CP adjacent to each other during the formation of the second insulating layer 160. As shown in FIG. 5J, the void or seam 165 may be connected to the air gap 150 through a passage 162 formed in the second insulating layer 160.

Referring to FIGS. 5I and 6C, a filling insulating layer 170 may be formed on the second insulating layer 160.

The filling insulating layer 170 may fill the void or seam 165, so that the air gap 150 may be interrupted from the outside. Thus, it is possible to prevent chemical materials used in subsequent processes from being moved into the air gap 150 through the void or seam 165.

In some example embodiments, the filling insulating layer 170 may include a nitride formed by an atomic layer deposition (ALD) process.

In other example embodiments, the filling insulating layer 170 may include an oxide formed by an ALD process.

Referring to FIGS. 3 and 4 again, a third insulating layer 175 may be formed on the filling insulating layer 170. The third insulating layer 175 may be used as an etch stop layer or a buffer layer in an etching process.

Figure 7A:
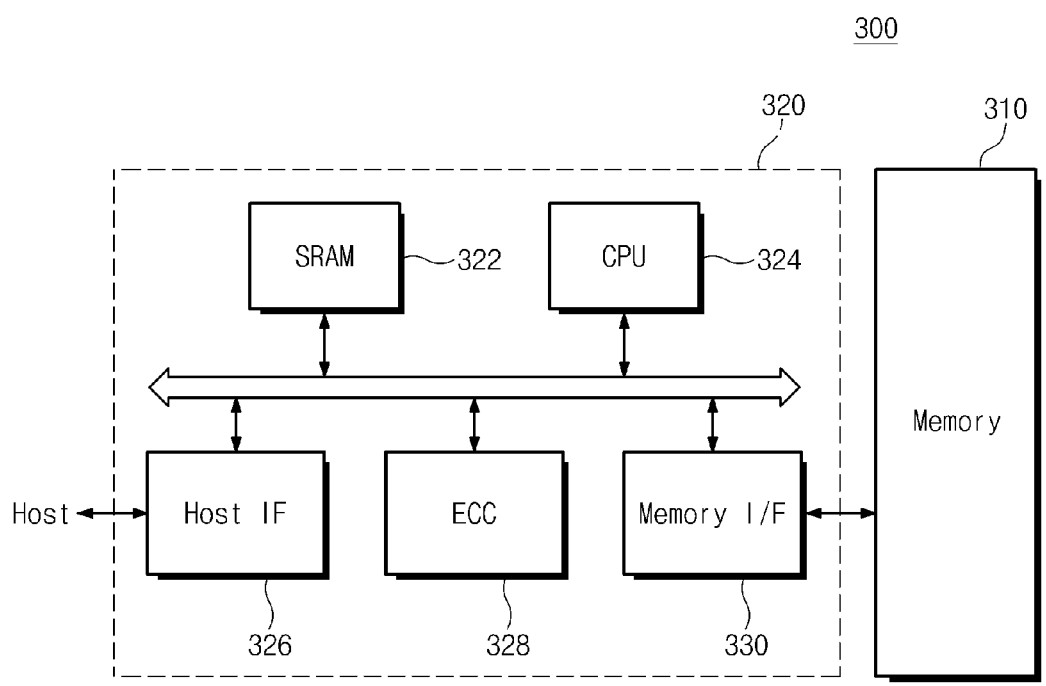
FIG. 7A is a schematic block diagram illustrating an example of memory cards including semiconductor devices according to still another example embodiment.

FIG. 7A is a schematic block diagram illustrating an example of memory cards including semiconductor devices according to still another example embodiment.

Referring to FIG. 7A, the semiconductor device according to example embodiments may be applied to a memory card 300. For example, the memory card 300 may include a memory controller 320 configured to control data communication between a host and a memory device 310. A SRAM device 322 may be used as an operation memory of a central processing unit (CPU) 324. A host interface unit 326 may be configured to include a data communication protocol between the memory card 300 and the host. An error check and correction (ECC) block 328 may detect and correct errors of data which are read out from the memory device 310. A memory interface unit 330 may interface the memory device 310. The CPU 324 controls overall operations of the memory controller 324.

If the memory device 310 applied to the memory card 300 includes the semiconductor device according to example embodiments, the void or seam may be filled with the filling insulating layer, such that it is possible to prevent the chemical materials from being moved into the air gap. Thus, damage of the semiconductor device may be suppressed.

Figure 7B:
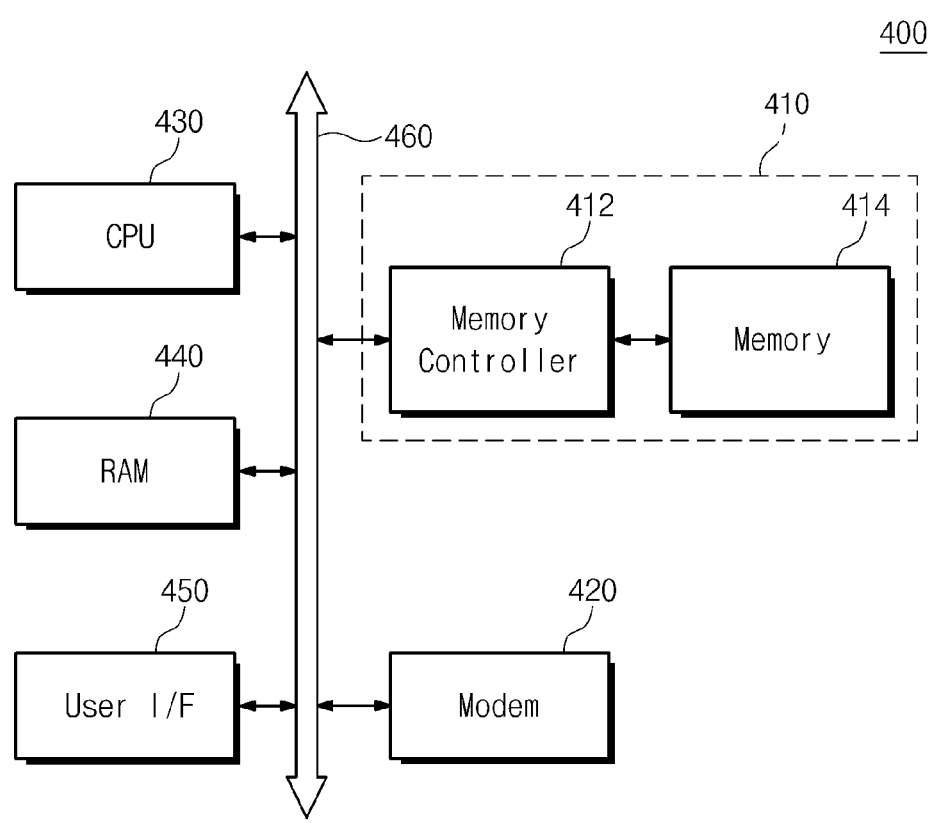
FIG. 7B is a schematic block diagram illustrating an example of systems including semiconductor devices according to a further example embodiment.

FIG. 7B is a schematic block diagram illustrating an example of systems including semiconductor devices according to a further example embodiment.

Referring to FIG. 7B, an information processing system 400 may include the semiconductor device according to example embodiments. The information processing system 400 may include a mobile device or a computer. For example, the information processing system 400 may include a modem 420, a central processing unit (CPU) 430, a random access memory (RAM) 440, and a user interface unit 450 that are electrically connected to a memory system 410 through a system bus 460. The memory system 410 may store data processed by the central processing unit 1330 or data inputted from an external device. The memory system 410 may include a memory device 412 and a memory controller 414. The memory system 410 may be substantially the same as the memory card 300 described with reference to FIG. 7A. The information processing system 400 may be realized as a memory card, a solid state disk (SSD) device, a camera image sensor and another type of application chipset. For example, the memory system 410 may consist of the SSD device. In this case, the information processing system 400 may stably and reliably store massive data.

According to example embodiments, the filling insulating layer may fill the void or seam between the contact pads adjacent to each other, so that a path between the air gap and the outside may be interrupted. Thus, it is possible to provide the semiconductor device including the cell gate patterns without damage.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
   selection gate patterns extending in a first direction on a substrate;
   cell gate patterns extending in parallel in the first direction between the selection gate patterns adjacent to each other;
   contact pads connected to first end parts of the cell gate patterns, respectively;
   an insulating layer covering the selection gate patterns, the cell gate patterns, and the contact pads, the insulating layer having a void or seam between the contact pads; and
   a filling insulating layer filling the void or seam in the insulating layer, wherein a top surface of the insulating layer is higher than top surfaces of the cell gate patterns.

2. The semiconductor device of claim 1, wherein the filling insulating layer includes an atomic layer deposition (ALD) nitride or an ALD oxide.

3. The semiconductor device of claim 1, wherein,
   a width of each of the cell gate patterns is substantially equal to a distance between the cell gate patterns adjacent to each other, and
   the insulating layer includes an air gap insulating the cell gate patterns.

4. The semiconductor device of claim 1, wherein,
   the contact pads and the cell gate patterns connected to each other constitute one body, and
   each of the contact pads has a first width along the first direction and a second width along a second direction substantially perpendicular to the first direction in a plan view, the second width being larger than the first width.

5. The semiconductor device of claim 1, wherein,
   the cell gate patterns adjacent to each other are spaced apart by a distance having a first width,
   the cell gate patterns and the selection gate patterns adjacent to each other are spaced apart by the distance having the first width, and
   the contact pads adjacent to each other are spaced apart by a distance having a second width greater than the first width.

6. The semiconductor device of claim 1, wherein the contact pads adjacent to each other are mirror-symmetric to each other with respect to a standard line extending in a second direction perpendicular to the first direction between the contact pads adjacent to each other in a plan view.

7. The semiconductor device of claim 1, wherein the insulating layer is composed of a first insulating layer including an air gap insulating the cell gate patterns, and a second insulating layer having the void or seam between the contact pads.

8. The semiconductor device of claim 7, wherein the first insulating layer includes a silane compound.

9. The semiconductor device of claim 1, wherein the cell gate patterns have mirror symmetry with respect to a standard line extending in the first direction.

10. The semiconductor device of claim 9, wherein,
    the cell gate patterns have lengths different from each other, and
    the cell gate patterns are arranged according to length such that the lengths of the cell gate patterns increase the closer the cell gate patterns are to the standard line.

11. The semiconductor device of claim 10, wherein the contact pads are respectively at empty regions defined by differences in the lengths of the cell gate patterns in a plan view.

12. The semiconductor device of claim 10, wherein the cell gate patterns have second end parts extending in a direction tilted with respect to the standard line in a plan view.

13. The semiconductor device of claim 12, wherein the direction tilted with respect to the standard line extends away from the standard line.

* * * * *